United States Patent
Turchetta (10) Patent No.: US 12,061,420 B2
(45) Date of Patent: Aug. 13, 2024

(54) 3-SIDE BUTTABLE STITCHED IMAGE SENSOR

(71) Applicant: IMASENIC Advanced Imaging S.L., Barcelona (ES)

(72) Inventor: Renato Turchetta, Barcelona (ES)

(73) Assignee: IMASENIC ADVANCED IMAGING S.L., Barcelona (ES)

(*) Notice: Subject to any disclaimer, the term of this patent is extended or adjusted under 35 U.S.C. 154(b) by 677 days.

(21) Appl. No.: 17/197,481

(22) Filed: Mar. 10, 2021

(65) Prior Publication Data
US 2021/0305305 A1    Sep. 30, 2021

(30) Foreign Application Priority Data
Mar. 24, 2020   (EP) ..................................... 20382222

(51) Int. Cl.
   *G03F 7/00*    (2006.01)
   *H01L 27/146*  (2006.01)

(52) U.S. Cl.
   CPC .... *G03F 7/70475* (2013.01); *H01L 27/14612* (2013.01); *H01L 27/14636* (2013.01); *H01L 27/14687* (2013.01)

(58) Field of Classification Search
   CPC ......... H01L 27/14612; H01L 27/14636; H01L 27/14687; H01L 27/14603;
   (Continued)

(56) References Cited

U.S. PATENT DOCUMENTS 5,990,503 A    11/1999   Ingram et al.
6,194,105 B1   2/2001    Cohen et al.
(Continued)

FOREIGN PATENT DOCUMENTS

GB    2504111 A    1/2014

OTHER PUBLICATIONS

P. P. Suni, "CCD wafer scale integration", Proceedings IEEE International Conference on Wafer Scale Integration (ICWSI). doi:10.1109/icwsi.1995.515446.
(Continued)

*Primary Examiner* — Nelson Garces
(74) *Attorney, Agent, or Firm* — 24IP Law Group USA, PLLC; Timothy R. DeWitt (57) ABSTRACT

A sensor fabricated from a plurality of layers on a semiconductor wafer. The sensor comprises a plurality of sensor elements arranged in stitching blocks and having a plurality of vertically arranged read-out lines, a plurality of vertically arranged select/reset lines, and a plurality of horizontally arranged select/reset lines, running from a right-hand edge to an oppositely disposed left hand edge and being connected to ones of the plurality of vertically arranged select/reset lines, plurality of read-out circuits connected to the plurality of vertically arranged read-out lines, and ones of the plurality of vertically arranged read-out lines swerve at one of the bottom or top edges of the stitching blocks, such that ones of the plurality of vertically arranged read-out lines in a first one of the plurality of stitching blocks connect to a displaced one of the vertical lines in a second abutting one of the plurality of stitching blocks.

6 Claims, 8 Drawing Sheets

(58) Field of Classification Search
CPC ......... H01L 27/14609; H01L 27/14683; H01L 27/1461; H01L 27/14634; H01L 27/1469; G03F 7/70475; G03F 7/70458; G03F 7/70466; H04N 25/46; H04N 25/74; H04N 25/76

See application file for complete search history.

(56) References Cited

U.S. PATENT DOCUMENTS

| | | | |
|---|---|---|---|
| 6,225,013 | B1 | 5/2001 | Ayelet et al. |
| 6,236,939 | B1 | 5/2001 | Augenstein et al. |
| 6,906,332 | B2 | 6/2005 | Kaifu et al. |
| 7,009,646 | B1 | 3/2006 | Fossum et al. |
| 7,659,516 | B2 | 2/2010 | Korthout et al. |
| 7,737,390 | B2 | 6/2010 | Sarig et al. |
| 9,247,169 | B2 | 1/2016 | Guerrini et al. |
| 2005/0104089 | A1 | 5/2005 | Chao et al. |
| 2011/0290984 | A1* | 12/2011 | Julien .................... H04N 25/75 250/208.1 |
| 2014/0057082 | A1 | 2/2014 | Liao et al. |
| 2015/0189208 | A1* | 7/2015 | Guerrini .......... H01L 27/14643 348/308 |
| 2019/0155144 | A1 | 5/2019 | Wang et al. |

OTHER PUBLICATIONS

P.J. Pool, W.A.F. Suske, J.E.U. Ashton, Design Aspect and Characterisation of EEV Large Area CCDs for Scientific & Medical Applications, SPIE vol. 1242 Charge-Coupled Devices and Solid-State Optical Sensors (1990), 17-25.

Korthout et al., A wafer-scale CMOS APS imager for medical X-ray applications, ISSW 2009.

* cited by examiner

| G | H<br>$(0,4L_y)$ | H<br>$(L_x,4L_y)$ | H<br>$(2L_x,4L_y)$ | H<br>$(3L_x,4L_y)$ | I |
|---|---|---|---|---|---|
| D | E<br>$(0,3L_y)$ | E<br>$(L_x,3L_y)$ | E<br>$(2L_x,3L_y)$ | E<br>$(3L_x,3L_y)$ | F |
| D | E<br>$(0,2L_y)$ | E<br>$(L_x,2L_y)$ | E<br>$(2L_x,2L_y)$ | E<br>$(3L_x,2L_y)$ | F |
| D | E<br>$(0, L_y)$ | E<br>$(L_x, L_y)$ | E<br>$(2L_x, L_y)$ | E<br>$(3L_x, L_y)$ | F |
| D | E<br>$(0, 0)$ | E<br>$(L_x, 0)$ | E<br>$(2L_x, 0)$ | E<br>$(3L_x, 0)$ | F |
| A | B<br>$(0,-H_b)$ | B<br>$(L_x,-H_b)$ | B<br>$(2L_x,-H_b)$ | B<br>$(3L_x,-H_b)$ | C |

| G | $(0, 4L_y)$ | $(L_x, 4L_y)$ | $(2L_x, 4L_y)$ | $(3L_x, 4L_y)$ | I |
|---|---|---|---|---|---|
| D | $(0, 3L_y)$ | $(L_x, 3L_y)$ | $(2L_x, 3L_y)$ | $(3L_x, 3L_y)$ | F |
| D | $(0, 2L_y)$ | $(L_x, 2L_y)$ | $(2L_x, 2L_y)$ | $(3L_x, 2L_y)$ | F |
| D | $(0, L_y-\varepsilon)$ | $(L_x, L_y-\varepsilon)$ | $(2L_x, L_y-\varepsilon)$ | $(3L_x, L_y-\varepsilon)$ | F |
| D | $(0, -\varepsilon)$ | $(L_x, -\varepsilon)$ | $(2L_x, -\varepsilon)$ | $(3L_x, -\varepsilon)$ | F |
| A | $(0, -H_b)$ | $(L_x, -H_b)$ | $(2L_x, -H_b)$ | $(3L_x, -H_b)$ | C |

3-SIDE BUTTABLE STITCHED IMAGE SENSOR

BACKGROUND OF THE INVENTION

Field of the Invention

This invention relates to a sensor with a plurality of sensor elements arranged in stitching blocks as well as a reticle for the manufacture of the sensor and a method for the manufacture of the sensor using the reticle.

Brief Description of the Related Art

Figure 13:
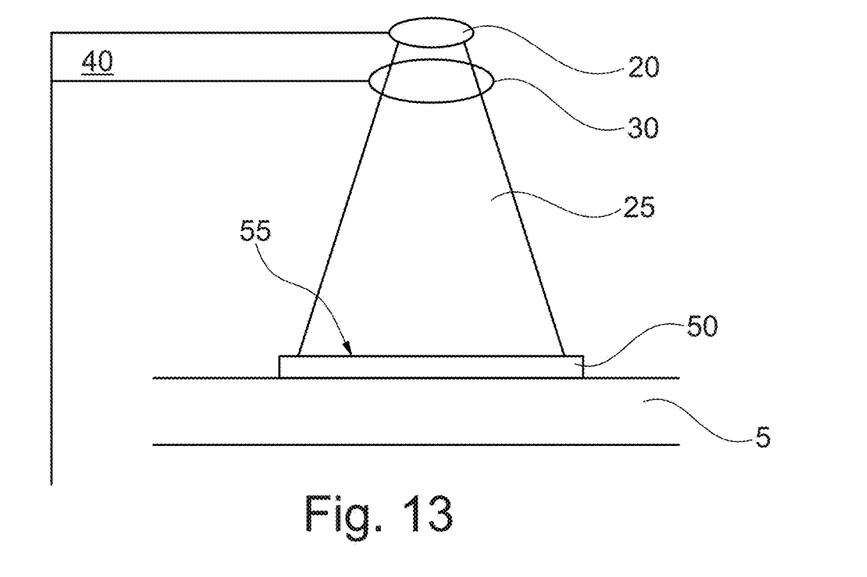
FIG. 13 shows an overview of a lithography process.

Microelectronic circuits are generally made using a process termed photolithography or optical lithography to pattern parts of the microelectronic circuit on a layer (such as a thin film) or on the surface of a semiconductor wafer (also called substrate) 5. An illustrative example of a lithography apparatus 10 is shown in FIG. 13.

Figure 14:
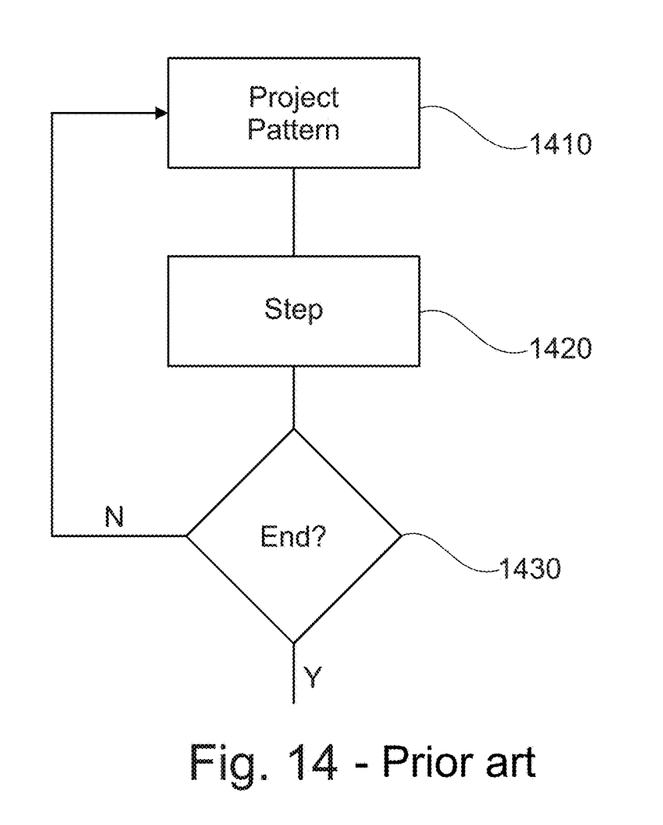
FIG. 14 shows a flow diagram for the lithography process.

The process using the lithography apparatus 10 is well-known and shown in FIG. 14. The process uses light 25 from a light source 20 to project in step 1410 a geometric pattern from a photomask 30 (also called reticle or optical mask) to a photosensitive chemical photoresist layer 50 on the surface of the semiconductor wafer or on the thin film (collectively numbered 5). Exposure of the photoresist layer 50 to the light causes a chemical change to the exposed parts of the photoresist layer 50 which allows these exposed parts 55 of the photoresist layer 50 to be selectively removed to create the geometric pattern in the photoresist layer.

A series of chemical treatments either etches the exposed part 55 forming the geometric pattern into the material, or enables deposition of a new material, such as metal tracks or lines, on the exposed part 55 in the desired geometrical pattern upon the material underneath the photoresist layer 50. Subsequently the photoresist layer 50 is removed by chemically altering the remaining photoresist in the photoresist layer 50 such that the photoresist layer 50 no longer adheres to the surface of the thin film or the substrate 5.

Modern semiconductor wafers 5 are large, and the optical masks or reticles 30 cannot project the geometrical pattern over the whole of the surface of the thin film or the semiconductor wafer 5 at the same time. The geometric patterns to be projected in step 1410 onto the surface of the semiconductor wafer 5 can be highly repetitive and, as a result, it is possible to create a series of geometrical patterns in the reticles 30 which are selectively projected onto the surface of the thin film or the semiconductor wafer 5. These geometrical patterns will be called blocks in this description. The reticle 30 is located in a stepper machine 40 which "steps" in step 1420 the reticle 30 over the surface of the thin film or the semiconductor wafer 5 such that selected areas of the photoresist layer 50 are exposed. The light source 20 can be arranged so that only certain blocks are illuminated through the reticle 30 at the required position on the surface of the semiconductor wafer or the thin film 5. The projection step 1410 and the stepping step 1420 continue until all the geometrical patterns have been projected onto the surface of the thin film or the semiconductor layer 5.

As noted above, in many applications, e.g., X-ray detection, electron detection, industrial, machine vision, photogrammetry or medium format photography, it is necessary to make image sensors on the semiconductor wafer 5 which are larger than the photolithographic field (reticle) produced by the optical mask 30 and used in the manufacturing of microelectronics devices. As the edges of the reticle 30 need to host structures other than the design of the microelectronic circuit, e.g., alignment marks or process control monitoring (PCM) structures, it is necessary to use a special technique to make large area devices as an image sensor. This technique is generally known as "stitching", as the full large area device is formed by "stitching" together several photolithographic exposures, in a seamless way.

The first stitched devices date back to the 1990s, when the manufacturing of VLSI (very large-scale integration) devices was becoming more stable and with a high yield. Although other applications were considered, one of the first applications developed was in the field of imaging. Early examples of imaging devices can be found in the publication by P. P. Suni, "CCD wafer scale integration", Proceedings IEEE International Conference on Wafer Scale Integration (ICWSI). doi: 10.1109/icwsi.1995.515446 and later in P. J. Pool, W. A. F. Suske, J. E. U. Ashton, "Design Aspect and Characterisation of EEV Large Area CCDs for Scientific ε Medical Applications, SPIE Vol. 1242 Charge-Coupled Devices and Solid-State Optical Sensors (1990), 17-25". All these examples refer to charge-coupled devices (CCD), which were at the time the dominant type of the imaging device.

After CMOS image sensors were invented in the early 1990s, stitching was also applied to this type of devices. The reference patent is U.S. Pat. No. 6,194,105 B1 which describes a way of making stitched image sensors in a CMOS technology and this method is used by most foundries nowadays for manufacturing the image sensors.

Unfortunately, some types of sensors, even of the size of a full wafer, are not large enough for some applications, e.g., X-ray radiography. It is then necessary to "tile" the sensors together to cover large areas, and the number of tiles necessary in one direction is often larger than two tiles. It is then necessary to make the sensors with a minimum amount of "dead area" on at least 3 sides to match the (three) sides of the sensors together to create the larger area. In this case, the sensor is called "3-side buttable". The "dead area" (i.e., area with no imaging devices) on the buttable sides in a 3-side, or even a 2-side buttable sensors, should be normally smaller than half a pixel, so that when the sensors are butted together, a maximum of one line, i.e., either a column or a row in the sensor, is lost.

There are several methods to make a 3-side buttable sensor. One method is described in Korthout et al., A wafer-scale CMOS APS imager for medical X-ray applications, ISSW 2009, http://www.imagesensors.org/Past%20Workshops/2009%20Workshop/2009%20Papers/070_paper_korthout_dalsa_wsc.pdf (downloaded on 18 Feb. 2020) in which it is described that some of the columns in the image sensor host a shift-register for addressing. The presence of the shift-registers in the columns would lead those columns of the image sensor to have reduced sensitivity, but this reduction in sensitivity can be corrected in the final image. The sensor is disclosed in a related patent in U.S. Pat. No. 7,659,516, which however does not cover any detail on stitching, or how to make the sensor 3-side buttable. The introduction of logic circuitry within the pixel area is like what is done also in U.S. Pat. No. 7,009,646.

Other patents disclose similar methods. For example, in U.S. Pat. No. 7,737,390 the selective exposure of masks, in this case via masks, is used to create blocks with slightly different design and then allowing all the control logic to be moved to the bottom part of the sensor, thus leaving three sides free from any circuitry. The same result is achieved in U.S. Pat. No. 9,247,169 by using extra control lines and some circuitry integrated directly in the focal plane of the sensor.

Similarly, UK Patent Application GB 2 504 111 teaches an imaging sensor device that comprises a pixel sensor array made up of several stitching blocks, each comprising pixel sensors disposed in at least one row group and having two groups of addressing lines, i.e., a first and second groups of addressing lines. The arrangement of the pixel sensors and the addressing lines in each stitching block is the same. Row addressing circuitry is disposed along an external edge of the array parallel to the rows of pixel sensors and coupled to the pixel sensors using the first group of addressing lines for performing row addressing actions. The '111 patent application has so-called "group addressing circuitry" which is also disposed along the same edge of the array and coupled to the pixel sensors using at least some of the second group of addressing lines for performing a group addressing action. The second group of addressing lines have an L-shape or step shape ("swerve").

In the GB'111 patent application, each stitching block combines a row addressing action with a group addressing action to select only one row of one row group of one stitching block simultaneously. The first group of addressing lines and the second group of addressing lines are connected to logic gates to enable addressing of the individual pixel sensors in the pixel sensor array. The staggering or swerving of the second group of addressing lines means that these (second group of) addressing lines effectively run diagonally across the sensor array. The imaging sensor device has a plurality of read-out lines which is arranged to provide a signal from a single pixel sensor of each of a plurality of rows in the pixel sensor array when selected by the first and second groups of addressing lines. These read out lines are not staggered (or swerved).

SUMMARY OF THE INVENTION

In a preferred embodiment, the present invention is a sensor fabricated from a plurality of layers on a semiconductor wafer. The sensor comprises a plurality of sensor elements arranged in stitching blocks and having a plurality of vertically arranged read-out lines, a plurality of vertically arranged select/reset lines, and a plurality of horizontally arranged select/reset lines. The plurality of vertically arranged readout lines run from a bottom edge in the direction of an oppositely disposed top edge. The plurality of vertically arranged select/reset lines runs from a bottom edge in the direction of an oppositely disposed top edge. The plurality of horizontally arranged select/reset lines runs from a right-hand edge to an oppositely disposed left hand edge and is connected to ones of the plurality of vertically arranged select/reset lines.

A plurality of read-out circuits is connected to the plurality of vertically arranged read-out lines, and ones of the plurality of vertically arranged read-out lines have a swerve at one of the bottom edges or the top edges of the stitching blocks, such that ones of the plurality of vertically arranged read-out lines in a first one of the plurality of stitching blocks connect to a displaced one of the vertical lines in a second abutting one of the plurality of stitching blocks.

This circuit arrangement of the sensor of the disclosure saves on real estate because there is no need to use logic gates to select the individual pixels for read out and furthermore it enables the read out of multiple pixels at the same time on the multiple read-out lines.

In one aspect, the sensor elements of the sensor are 3-transistor pixels. There can be N stitching bocks and at least N vertically arranged read-out lines.

The sensor can be used as an imaging sensor.

This document also teaches a reticle for fabricating the sensor with a plurality of sensor elements. The reticle comprises a plurality of blocks for creation of geometric patterns in a lithography process for creating a plurality of tracks on a surface of one of a semiconductor substrate or a thin film on the semiconductor substrate, wherein the reticle comprises a plurality of metal track patterns running to a short distance ε from a top edge of the one of the plurality of blocks. At least one of the geometric patterns includes a swerve, such as a dogleg, for enabling at least one of the plurality of metal tracks to be connected to a displaced one of the plurality of metal tracks.

One of the geometric patterns in the plurality of blocks is designed to produce a plurality of parallel arranged metal tracks on the surface of one of a semiconductor substrate or a thin film on the semiconductor substrate in at least one of the plurality of sensor elements.

The document also discloses a method for fabricating a sensor using a lithography process with the reticle. The method comprises projecting a first pattern from one of the plurality of blocks of the reticle onto a first area of the surface of one of the thin film or the semiconductor wafer to create a first plurality of tracks on the surface of the thin film or the semiconductor wafer. The reticle is stepped by a step equivalent to the size of the one of the plurality of blocks less the short distance ε, and the first pattern is projected onto a second area of the surface of the thin film or the semiconductor wafer to create a second plurality of tracks on the surface of the thin film or the semiconductor wafer, such that ones of the first plurality of tracks match with corresponding ones of the second plurality of tracks to create complete tracks on the surface of the thin film or the semiconductor wafer.

BRIEF DESCRIPTION OF THE FIGURES

For a more complete understanding of the present invention and the advantages thereof, reference is now made to the following description and the accompanying drawings, in which.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

The concept of stitching will now be described with reference to FIG. 1 which is derived from the teachings of U.S. Pat. No. 6,194,105 B1.

Figure 1:
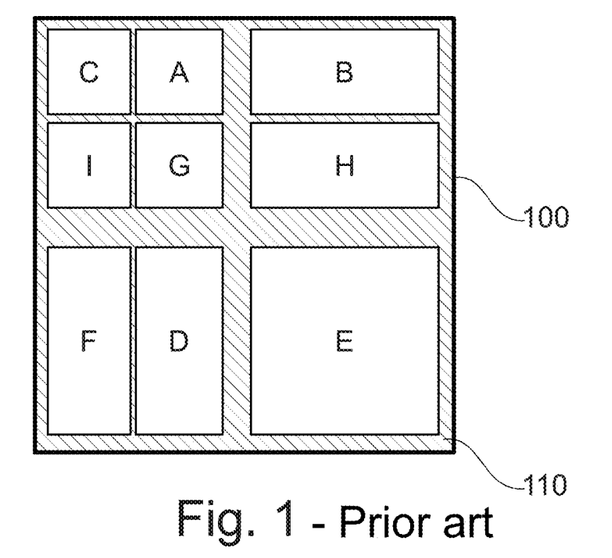
FIG. 1 shows a prior art reticle.

A reticle 100 is in this non-limiting example partitioned into nine blocks, labelled A-H, as shown in detail in FIG. 1. The hatched area 110 in FIG. 1 includes test devices and scribe lines which are not shown in the figure in detail.

In a conventional, non-stitched sensor, the whole of the reticle 100 is exposed during a photolithographic process and then stepped using a stepper machine 40 and repeated across the semiconductor wafer 5 to make different chips. Each of the mask layers has its own reticle 100. In the prior art stitching methods, on the other hand, only part of the reticle 100 is exposed at any time during the lithographic process, as noted in the introduction.

In FIG. 1, the blocks labelled letters A-G represent different parts of the design of the microelectronic circuit representing the sensor. As a non-limiting example, in a first exposure sequence, the blocks C, A, I and G are exposed. In a second exposure sequence the blocks B and H are exposed, in a third exposure sequence, the blocks F and D are exposed and in a fourth exposure sequence the blocks E are exposed using the lithographic process outlined in the introduction. There will be four exposures for each of the blocks H-B and F-D and sixteens exposure for the blocks E. By programming the stepper machine 40 correctly, one can build on the semiconductor wafer 5 a sensor in manner shown in FIG. 2, which shows the so-called "stitching plan". It can be seen in FIG. 2 that the blocks E represent pixels, C, A, I, and G are corner blocks from FIG. 1, B and H are bottom blocks, and top blocks and D and F are left blocks and right blocks.

It will be appreciated that the terminology "top," "bottom," "right," "left," "vertical," "horizontal," "row," and "column" is only used in this document to distinguish the various blocks, metal tracks and circuits and is not intended to have any meaning limited to a particular geometry.

Figure 2:
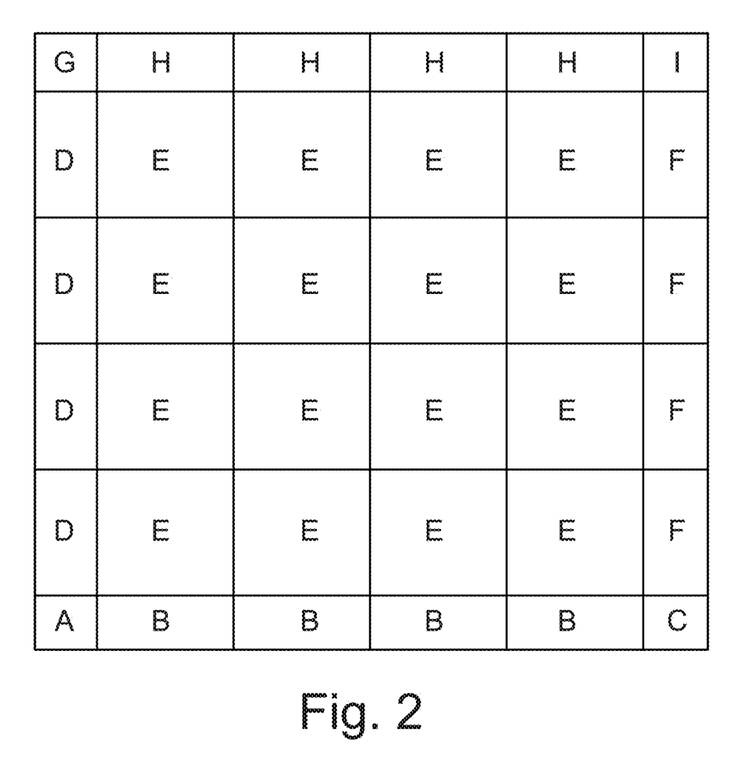
FIG. 2 shows a stitching plan.

The reason for the stepper program used in the stepper machine 40 and shown in FIG. 2 is that on the semiconductor wafer 5 there will be in general more than one sensor. So, for example, by printing the blocks B and H together, one block of the blocks B/H is used for one sensor and the other of the blocks H/B is used for the sensor immediately above or below, as will be seen by considering the top right-hand corner of FIG. 1. The reticle 30 can be so arranged that light 25 from the light source 20 projects the geometrical pattern from blocks B and H so that the blocks B and H can be used in separate, but adjacent image sensors. The number of blocks will in general be given by the value N×M, as will be explained below.

Using this method, it is now possible to create a plurality of sensors on the semiconductor wafer 5 up to the size of the semiconductor wafer 5 and only limited by the circular geometry of the semiconductor wafer 5.

Figure 3:
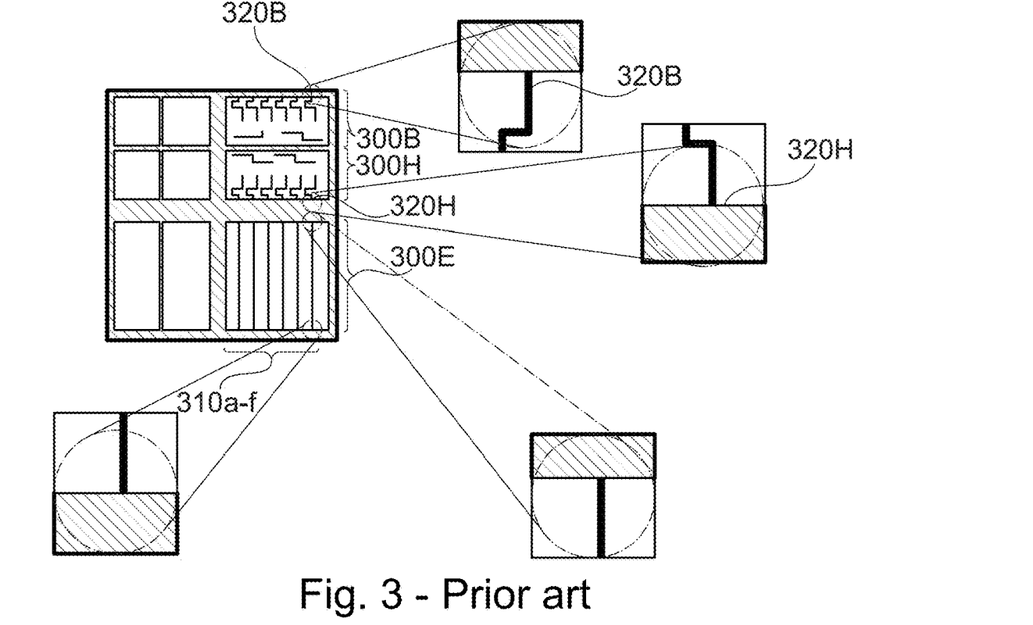
FIG. 3 shows a prior art mask for conventional stitching.

One of the issues that needs to be addressed in creating a large sensor is the breaking of lines or metal tracks. Consider the reticle Mx 300 used in the lithographic process, e.g., a metal mask Mx, where x could correspond to any metal level in the microelectronic circuit manufacturing process. For example, x could be 1, 2 or 3, and the corresponding metal level would be M1, M2 or M3, which are respectively the first, second and third metal level starting from the metal level closest to the silicon surface of the semiconductor wafer 5. It will be appreciated that the method described is not limited to a metal mask or any specific mask. A non-limiting example of the reticle 300 is shown in FIG. 3. For sake of simplicity, only six lines 310a-f (columns) are shown in block 300E, equivalent to blocks E of FIG. 1. Some lines 320B and 320H on the same reticle 300 for the blocks 300B and 300H (equivalent to B and H of FIG. 1) are also shown, just to illustrate that other shapes would exist as well, as is normal in the design of a microelectronic circuit. Several inserts are shown in FIG. 3 representing zoom views of the boundaries for the blocks 300B and 300H are also provided which will illustrate the location at which the stitching between the blocks 300B and 300H will occur.

In the blocks 300B, 300H and 300E the black lines (310a-f, 320B and 320H) representing the tracks are provided right up to the edge of the corresponding ones of the blocks 300B, 300H and 300E. This enables, after stitching together of the blocks, a very long line for the metal track produced on the thin film or the semiconductor wafer 5 going from the top to the bottom of the sensor to be created, i.e., from block H to block B through blocks E. This is typical for example of the metal tracks forming the readout lines from the sensor. These readout lines are normally vertical and run from one top edge to an oppositely disposed bottom edge of the sensor. It will be appreciated that, although the description here relates to vertical lines, the same is true for horizontal lines. The horizontal lines are typically used to create the metal tracks on the thin film or the semiconductor wafer 5 for control lines for the pixels in the sensor.

Figure 4:
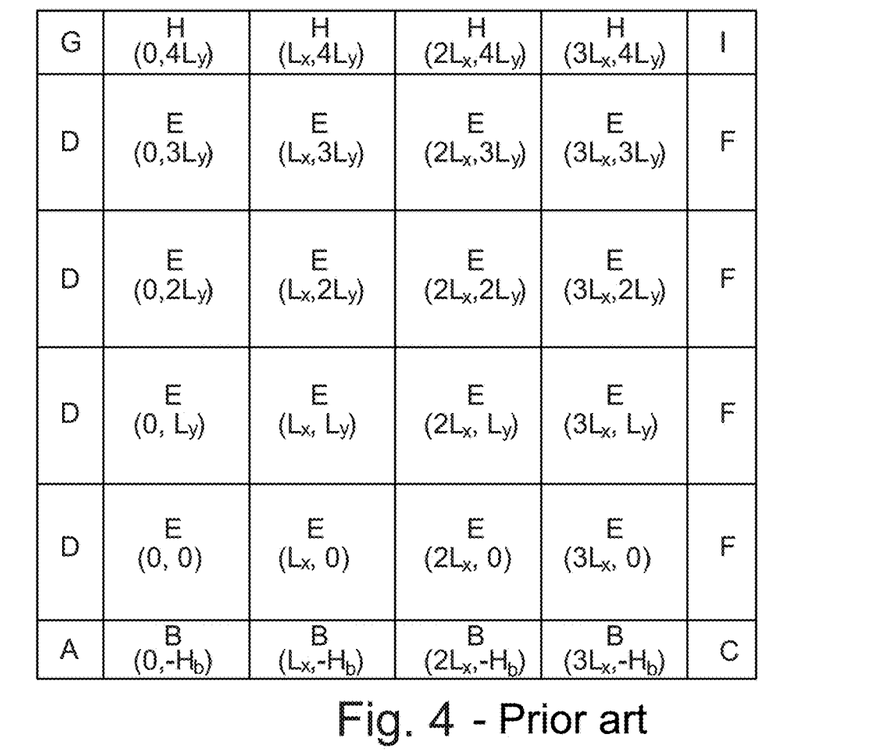
FIG. 4 shows a stepper program for conventional stitching.

The stepper machine 40 to create these lines would be programmed as shown in FIG. 4 i.e., in a very regular way. In this figure, the blocks E are rectangles with a size of length $L_x$ (in x-direction) and $L_y$ (in y-direction). The coordinates x and y of the bottom-left corner of each of the stitching blocks E, B and H are shown for each block as (x, y). The block E has dimensions of $L_x$ in the x-direction and $L_y$ in the y-direction. The blocks B and H have a dimension of $H_b$ and $H_n$ in the y-direction, respectively.

This arrangement of the reticle 300 and the steps in the stepper machine 40 will produce vertical lines on the thin film or semiconductor wafer 5 which go from the block B through the block E to the block H in the sensor with no break. This is known to be a problem for high-speed sensor due to parasitic RC resistance in the microelectronic circuit forming the sensor.

For non-stitched sensors one of the ways of reducing the parasitic RC resistance is to break the readout lines in the middle of the non-stitched sensors and to provide readout circuits both at the top and the bottom of the non-stitched sensor. In this way, the parasitic RC resistance of the line, which is the dominant factor in determining the speed at which the sensor can be read out, is reduced by half (i.e., divided by 2). Each of the vertical lines is now read out by two read-out circuits. Overall, a gain of a factor of four is then obtained on speed of readout of the pixels, i.e., on the line rate. If the rest of the circuitry, e.g., ADCs, data serializers, IOs is designed to cope with the increased line rate, then a factor of four is gained in the speed of read-out from the sensor.

For the stitched sensors, this solution has not been done to date because the stitching method is as described above. The method described in this document enables the breaking of the line and doubling of the read-out circuits even in the stitched sensors, thus allowing a factor of four increase in the speed of readout of the large area sensors.

Figure 5:
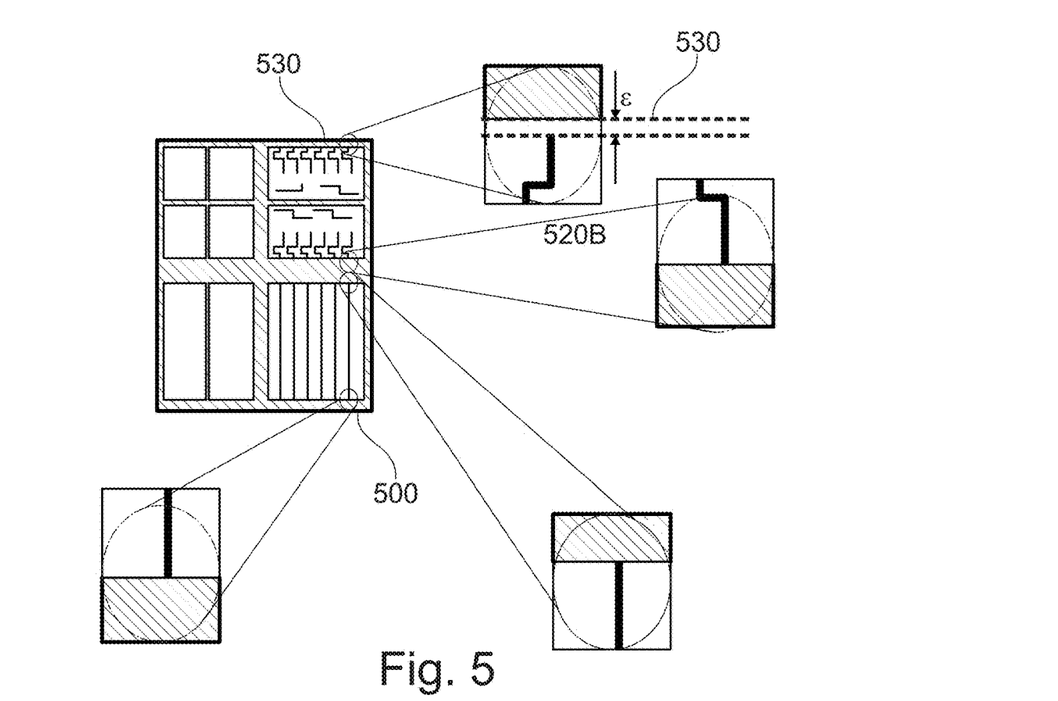
FIG. 5 shows a novel mask for stitching.

FIG. 5 shows an example of a new type of reticle 500 that can be used. The design needs to be modified. As shown in FIG. 5, the design of the lines 520B in block B is changed. As can be seen in the insert, on one layer the lines 520B that are to be broken (i.e., not form a complete line) do not reach the (top) edge 530 of the design, i.e., a "stitching boundary", but the line 520B is stopped at a distance ε from the point at which the line 520B would normally be stopped at the edge 530.

Figure 6:
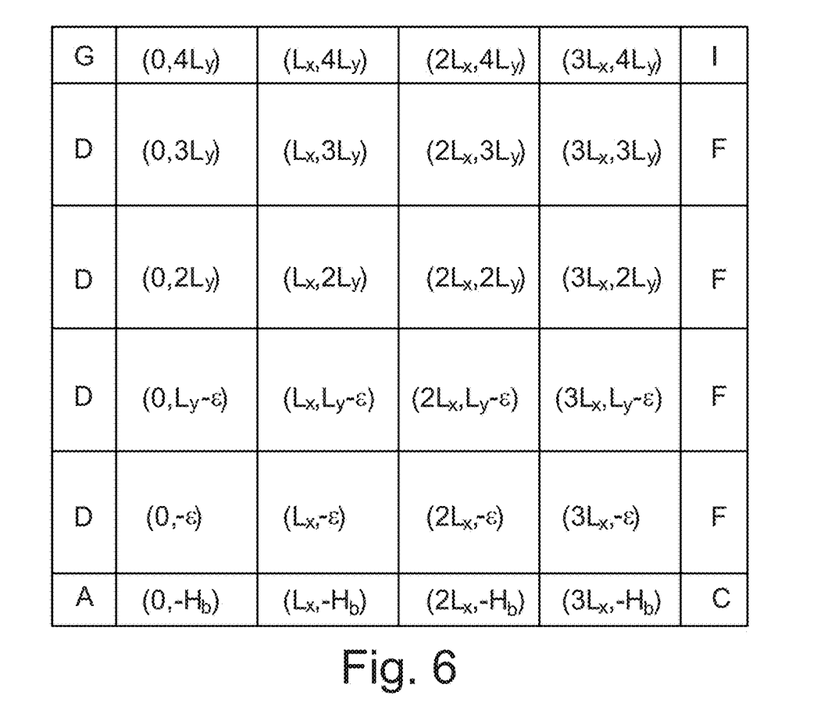
FIG. 6 shows a stepper program for novel stitching.

The stepper machine 40 also needs to be programmed in a different way to consider the distance ε. This re-programming is shown in FIG. 6. Most of the steps remain the same, but it will be noticed that the vertical steps for the blocks E in the lower part of FIG. 6 are modified by the same quantity distance E. The result of the re-programming is two-fold: i) in the middle of the sensor, the vertical lines are now interrupted and the gap between the top and bottom part of the line is given by the distance ε; ii) at the bottom, on the boundary of the blocks E and B, the line in the block E will be printed a distance ε beyond the border of the block B, thus restoring the connection with the corresponding line in the block B and also avoiding any double exposure, which could result in problems during manufacturing of the microelectronic circuit.

The quantity for the distance ε can be chosen according to the requirement of a specific technology. For example, in a modern 180 nm process, where a cut line around the stitching boundary is 1 μm, a dimension of around 1 μm for the distance E seems to be sufficient to guarantee that every line is broken in the middle and that no short circuit exists between a top part and a bottom part of the same line. This would allow small pixels to be stitched with this technique, e.g., <5 μm pixels could be stitched in this way. For larger pixels, larger distances ε could be used to reduce the risk of short-circuits and if any other design features, e.g., the position of contacts and vias, allow the larger distance.

As explained above, the same method could be applied to horizontal lines. It is also not necessary for all the lines on one of the reticles 500 to be broken in the same way. It is also possible to apply this technique for any of the reticles 500 separately, in agreement with the other design rules of the process.

Prior art methods for creating 3-side buttable, stitched sensors are known and discussed in the prior art section. In the following a further method is disclosed that can be used to make 3-side buttable sensors. This method also brings advantages for the readout speed of the sensor.

Figure 7:
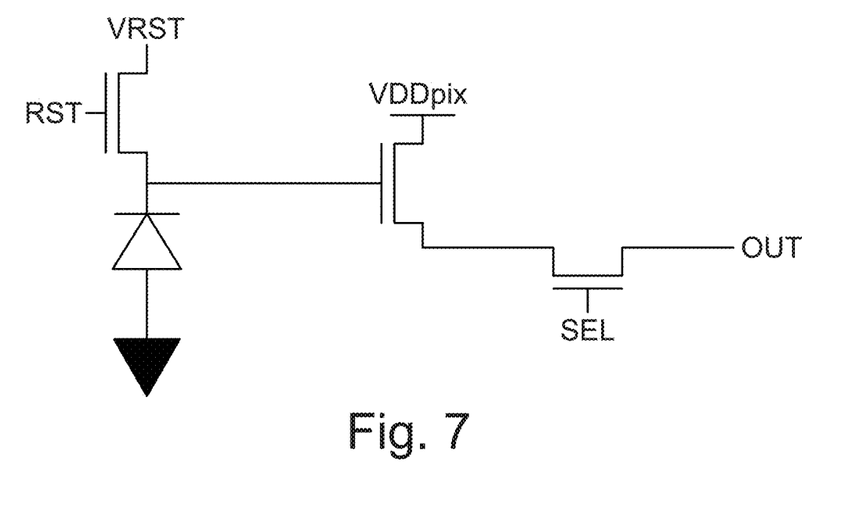
FIG. 7 shows a 3T pixel.

For sake of simplicity a 3T (3 transistors) pixel 700 will be considered and a schematic of this 3T pixel is shown in FIG. 7. FIG. 7 shows three MOS field effect transistors (FET) 710, 720, 730. The reset transistor 710 is connected to a reset RST line for resetting the pixel 700. The select transistor 730 has a gate connected to a select SEL line for selecting the pixel 700 for read out through the OUT line. The same or similar readout method could be applied to more complex pixels.

Figure 8:
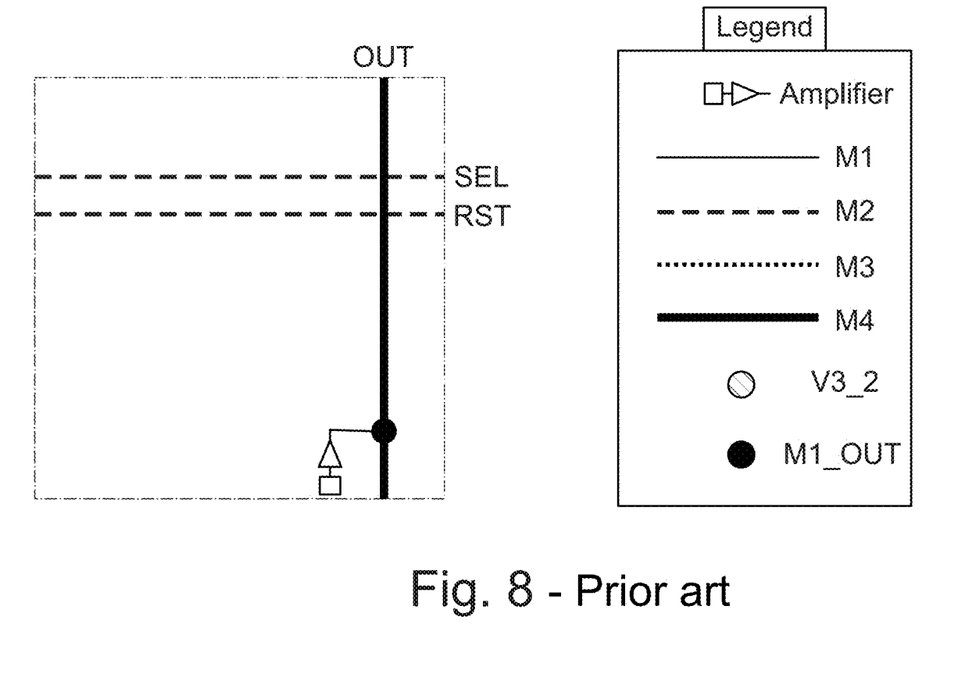
FIG. 8 shows the layout of a 3T pixel for a conventional sensor.

FIG. 8 shows the layer of the pixel 700 with the reset RST line and the select SEL line shown as horizontal tracks arranged in a row and the OUT line as a vertical track arranged in a column. The layers are marked M1, M2, M3 and M4 and represent the different layers of the metal tracks formed by different layers of the thin films. V3_2 corresponds to the via created between layers in the process that connects the metal tracks on the layer M2 to the metal tracks on the layer M3, often called "via 2 to 3". The symbol M1_OUT is used as a shortcut to indicate that combination of the metal tracks and the vias that will connect the local output of a pixel on M1 to the output lines on the track M4. Other combinations of the metal layers are of course possible.

These pixels are read in a so-called "rolling shutter" fashion. The basic idea of the so-called "rolling readout" is that, at any one time, one of the rows in the sensor is selected for readout. In the sensor, the RST and SEL lines of all the pixels 700 in the same row are connected and the OUT lines of all the pixels 700 in the same column are connected. In this way, the readout of the pixel 700 is done by generating a SEL signal for one row in which the pixels 700 are located. This SEL signal is connected—in this example—to the gates of the select transistors 730 in the pixel 700 activates all the corresponding select transistors 730 in one row and connect all the pixels 700 in that row to their corresponding OUT line. No other pixel in that column is connected to the OUT line, as the values of the select SEL are low for all the other rows, and so that the voltage appearing on this OUT line depends only on the amount of charge in the diode of that connected pixel 700 in the selected row. At the end of the readout, all the pixels 700 in that selected row are reset by activating the RST transistors 710 in the pixels 700 in that row. The pixels in that row can now start integrating the next frame, while the control moves to the following row and the method for readout is repeated until all the rows have been read. In the following row, the readout values on the correspond OUT line correspond to the amount of charge on the diode of the pixel connected in the following row.

This arrangement with the horizontal control (RST and SEL) signals and the vertical output lines in the column is standard in the art, and in a conventional sensor, row drivers for applying the RST and SEL signal to the pixels 700 in the row would be located on the left and/or right side of the array of pixels 700, with the output amplifier and related circuitry being at the bottom of the array of pixels 700. The row drivers take some real estate on the semiconductor 5, which, although not huge, is normally equivalent to at least a few pixels, even for the sensor with large pixels (e.g., >50 μm). It is thus impossible to butt the sensors right and left as the gap between the sensors would be otherwise too big.

One solution to this problem of butting the sensors on the right and the left, as well as at the top (where normally there is not much circuitry, even in a conventional sensor), is to move the control circuitry for the row to the bottom of the sensor, so that the problem becomes one of how to address the horizontal row with the RST and/or SEL signals that come from the bottom of the sensor.

Figure 9:
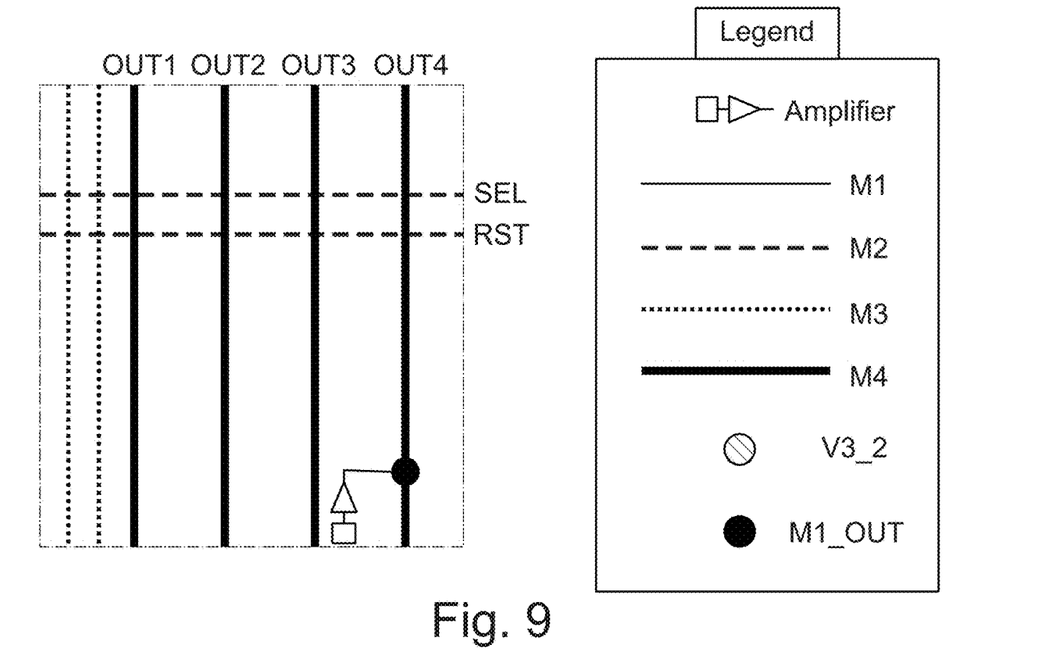
FIG. 9 shows the layout of a 3T pixel for 3-side buttable sensors of this document.

To make the sensor 3-side buttable, the layout of each individual pixel 900 is modified as shown in FIG. 9. This layout of FIG. 9 can be compared to the prior art layout in FIG. 8. It can be seen that vertical lines OUT1, OUT2, OUT3 are added to the exiting OUT4 line. The vertical lines OUT1, OUT2, OUT3 run from the bottom edge 910 to the top edge 920 of the array of the pixels 700 and are used to connect the row drivers which are now located at the bottom of the sensor. The number of output lines, i.e., the vertical lines OUT1, OUT2, OUT3, is increased. The number of output lines OUT1, OUT2, OUT3 will need to be (at least) equal to the number of stitching blocks in the vertical direction in the sensor, if the lines OUTi (i=1,2,3,4) are not broken as described earlier, or equal to the same number divided by 2 in the case the lines are broken as previously described.

Figure 10:
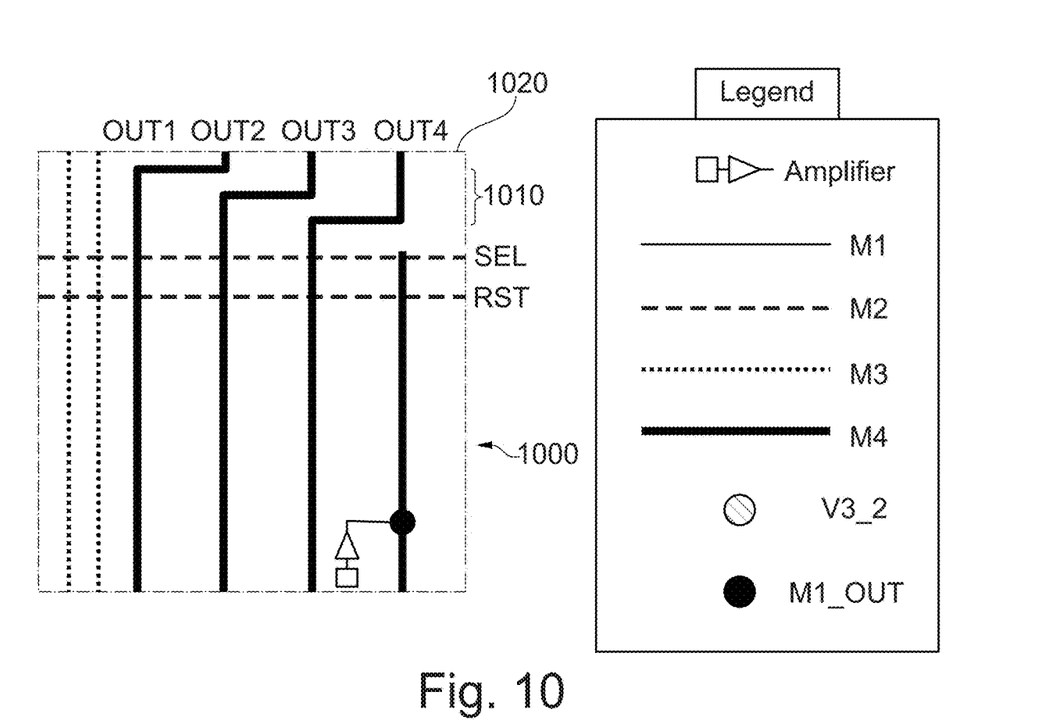
FIG. 10 shows layout of the topmost pixels in block E
Figure 11:
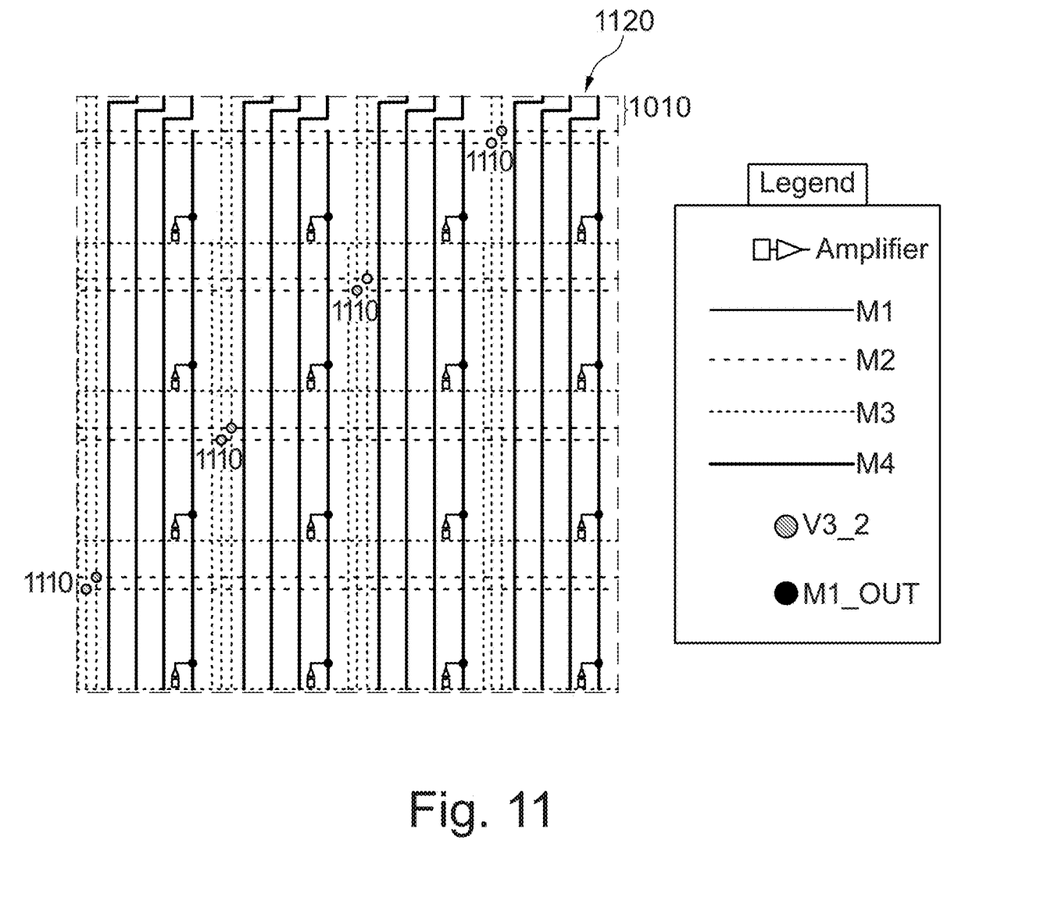
FIG. 11 shows the layout of block E.

The layout of the topmost pixel 1000 in every column of block E will be modified at the top edge 1020 as shown in FIG. 10. In this case the output lines OUT1, OUT2, and OUT 3 make a dogleg 1030 just before the top edge 1020 of the topmost pixel 1000. The pixels 1000 will then be arranged in block E as shown in FIG. 11. The dogleg 1030 is created using the geometrical pattern in the reticle in block E at the top pixel of in the columns of block E. It will be appreciated that the design of the dogleg 1030 is merely one non-limiting example of a "swerve" or "deviation" from one column to another column. This swerve could also be implemented by a curve, arc, or diagonal line. It is only required that the output lines OUT1, OUT2 and OUT3 do not form a continuous column through the stitched together blocks E and that one end of a line OUT(i) in one block E is positioned where the other end of the line OUT(i+1) starts in the following block E. It will be appreciated that the dogleg design of the swerve will be the most efficient in the use of real estate.

It will be noticed that V3_2 vias 1110 to connect the vertical M3 lines to the horizontal M2 lines are placed in one and only one pixel 1000 in every column and in every row. In this way, each of the vertical lines has a unique correspondence to a horizontal line, and in each stitching block, the rows can be uniquely addressed. In the case that the number of rows is not equal to the number of columns, it will be possible to provide extra or less vertical lines and place the vias 1110 accordingly. In the illustration of FIG. 11, only the case of a square block for sake of simplicity, but this is not a design limitation.

It will be observed that in each column, the rightmost output line does not reach the topmost column edge 1120 of the block E.

Figure 12:
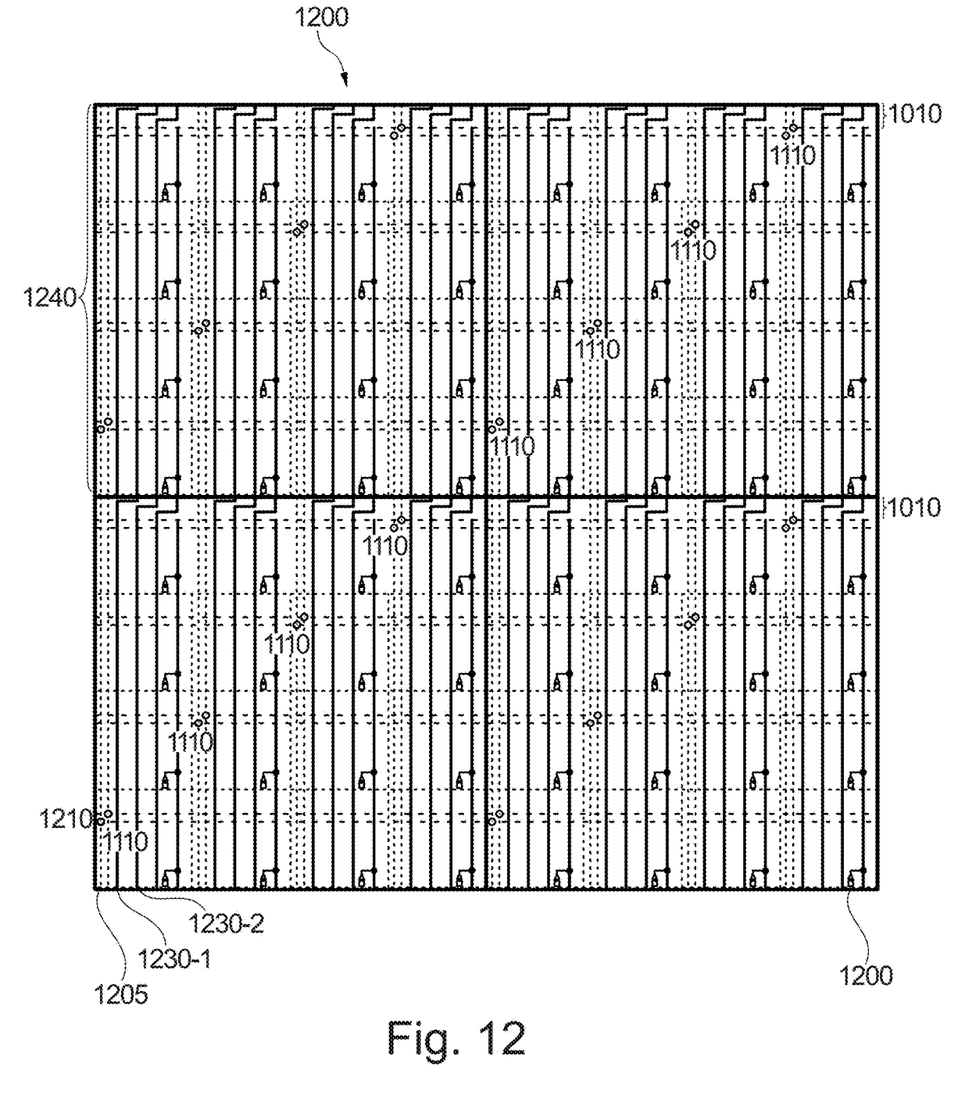
FIG. 12 shows the layout of the blocks E for a sensor, where the pixel array is made of two repetitions of block E in both the horizontal and the vertical direction.

FIG. 12 shows a pixel array 1200 made of 2×2 blocks E. The edges of the stitching blocks are marked with thick lines, but it will be appreciated these thick lines are not physical lines and are merely added to make it easy to identify the single stitching blocks.

Suppose that a leftmost vertically arranged select line 1205 is asserted in each stitching block, i.e., switched on. This leftmost row select line 1205 will select all of the pixels 700 in the bottom row 1210 in every one of stitching blocks E, then connecting the pixels 700 to the corresponding readout line 1230. The pixels 700 in the bottom left stitching block will be connected to the rightmost readout line 1230-1 in each column (corresponding to line OUT1 in FIG. 10) and the pixels in the top left stitching block will be connected to the next readout line 1230-2 which is displaced to the left in each column (corresponding to line OUT2 in FIG. 10), as the swerve implemented in this example with the dogleg 1030 of the topmost pixel 1240 in the bottom left stitching block changes the line or track to which the pixels 700 are connected in each stitching block. In this example, the selection SEL signal on the leftmost row selection line 1205 selects two rows in two different stitching blocks, i.e., one row per stitching block, and the pixels 700 in two different selected are read out on separate readout lines 1230-1 and 1230-2 in this simple example.

If there are N(vertical)×M(horizontal) stitching blocks, then N rows can be simultaneously read, thus improving the speed by a factor N. This will require the same number N of readout lines.

By avoiding simultaneous addressing of neighboring rows, it means that if one of the control lines is failing or lost, then multiple one of the adjoining rows are also not lost. The loss of multiple rows, and/or multiple columns, would almost certainly mean that the sensor would be considered not to be working. As any failing line is separated by one stitching block, the defects would only be of single failing lines, something which is normally acceptable. As long as the number of acceptable single failing lines on the sensor is not too large and is within specifications, the sensor would pass the selection criteria, thus improving the fabrication yield. It will be appreciated that his is an improvement also over non-stitched sensors, in which, whenever multiple ones of the lines are selected, the multiple lines are neighbors. The skilled person will appreciate that the same technique described in this document could then be applied to non-stitched sensors as well in order to increase the yield of fast sensors.

It will be appreciated that if there are fewer stitching blocks, it is possible to keep the same number of metal lines or modify only the M4 mask to reduce the number of metal lines and increase the fill factor. It is also possible that one more via mask will also need to be modified.

In the figures, the horizontal lines in the rows of the sensor are shown to be complete and go uninterrupted from a right-hand vertical edge of the stitching block to the left-hand vertical edge of the stitching block so that the rows traverse all the stitching blocks in an uninterrupted manner across the entire sensor. This can be done but it is not necessary as the horizontal lines could be made to terminate before the right edge of the stitching block. No special technique would be needed to do this, as stitching bocks will remain identical. It will be up to the design of the microelectronic circuit to decide whether it is better to break or not the lines at the edge of every stitching block.

The method outlined in this document only makes use of different connection arrangements. It does not need to integrate any extra circuitry in the pixel array, as it is done in some of the prior art.

The construction of the reticle and the construction of the break in the output lines can be used together. The reticle requires that the readout to be at the top and the bottom of the sensor and thus the final sensor will not be 3-side buttable but 2-side buttable.

In order for the break the shift of the distance needs to be applied at least to vertical lines on M4, and possibly on M3 to make the architecture more symmetric.

It will be appreciated that the design of the stitching block in this document is described with respect to 3-D stitching in which the stitching blocks, but it is equally applicable to so-called 1- and 2-D stitching.

REFERENCE NUMERALS

5 Semiconductor wafer/thin film
10 Lithographic apparatus
20 Light source
25 Light
30 Photomask/reticle/optical mask
40 Stepper machine
50 Photoresist layer
55 Exposed parts
100 Reticle
110 Test devices and scribe lines
300 Reticle
310a-f Columns
320B,H Lines
500 Reticle
520B Lines
520 Top edge
ε Distance
700 Pixel
710 Reset transistor
720 Transistor 730 Select transistor
900 Pixel
910 Bottom edge
920 Top edge
1000 Pixel
1010 Bottom edge
1020 Top edge
1030 Dogleg
1120 Topmost column edge
1200 Pixel array
1205 Leftmost vertically arranged select line
1210 Bottom row
1230 Readout line
1240 Topmost pixel

What is claimed is:

1. A sensor fabricated from a plurality of layers on a semiconductor wafer and comprising:
a plurality of 3-side buttable sensor elements arranged in stitching blocks and having:
a plurality of vertically arranged read-out lines, the plurality of vertically arranged readout lines running from a bottom edge in the direction of an oppositely disposed top edge,
a plurality of vertically arranged select/reset lines, the plurality of vertically arranged select/reset lines running from a bottom edge in the direction of an oppositely disposed top edge, and
a plurality of horizontally arranged select/reset lines, running from a right hand edge to an oppositely disposed left hand edge and being connected to ones of the plurality of vertically arranged select/reset lines;
wherein a plurality of read-out circuits is connected to the plurality of vertically arranged read-out lines;
wherein ones of the plurality of vertically arranged read-out lines have a swerve located on a same plane at one of the bottom edges or the top edges of the stitching blocks, such that ones of the plurality of vertically arranged read-out lines in a first one of the plurality of stitching blocks connect to a displaced one of the vertically arranged read-out lines in a second abutting one of the plurality of stitching blocks, and
wherein ones of the plurality of stitching blocks are stitched to at least one vertical stitching block and to the at least one horizontal stitching block.

2. The sensor of claim 1, wherein the sensor elements are 3-transistor pixels.

3. The sensor of claim 1, wherein the plurality of horizontal lines comprise row select line and row reset lines and wherein the sensor elements are connected to one of the row select lines and one of the row reset lines.

4. The sensor of claim 1, wherein one of the plurality of row select lines is connected to a single one of the vertically arranged select lines in one or more of the plurality of blocks.

5. The sensor of claim 1, wherein the stitching blocks comprise N vertical stitching blocks and M horizontal stitching blocks.

6. The sensor of claim 5, wherein the N vertical stitching blocks are readable simultaneously by N vertically arranged read-out lines.

* * * * *